United States Patent [19]

Boreas

[11] 4,140,969
[45] Feb. 20, 1979

[54] COMPACT MOVING COIL METER AND ROTOR ASSEMBLY

[75] Inventor: Willem J. L. Boreas, Sayreville, N.J.

[73] Assignee: Sangamo Weston, Inc., Atlanta, Ga.

[21] Appl. No.: 837,674

[22] Filed: Sep. 29, 1977

Related U.S. Application Data

[62] Division of Ser. No. 722,607, Sep. 13, 1976, Pat. No. 4,064,457.

[51] Int. Cl.² .......................... G01R 5/08; G01R 1/08
[52] U.S. Cl. ................................. 324/150; 324/154 R
[58] Field of Search ............ 324/150, 154 R, 154 PB, 324/155; 116/136.5, DIG. 6

[56] References Cited

U.S. PATENT DOCUMENTS

| | | | |
|---|---|---|---|
| 2,426,777 | 9/1947 | Lingel | 324/154 PB X |
| 3,325,734 | 6/1967 | Peltola | 324/154 R |
| 3,497,806 | 2/1970 | Nador et al. | 324/150 |
| 3,551,812 | 12/1970 | Mothes | 324/154 R X |
| 3,569,832 | 3/1971 | Marusek et al. | 324/150 |
| 3,583,360 | 6/1971 | Wehrung | 324/154 PB X |
| 3,621,393 | 11/1971 | Pignolet | 324/150 |

Primary Examiner—Gerard R. Strecker
Attorney, Agent, or Firm—W. R. Sherman; Kevin McMahon; Walter Kruger

[57] ABSTRACT

A compact meter with a unitary bridge including magnet support legs to which a magnet is clamped by a magnetically permeable plate and a U-shaped magnet support. Locating surfaces on the bridge cooperate with locating surfaces on the magnet, on the plate, and on the magnet support to locate these elements with respect to the bridge and the rotor. The magnetically permeable plate extends through the coil, and the region below the magnet is substantially unobstructed so that magnets of different thicknesses can be substituted, while using the same bridge, rotor and coil assembly, and plate. In a preferred embodiment the magnetically permeable plate has offset ends which permit inverting the plate to accommodate magnets of two different thicknesses while alowing the use of the same magnet support. The rotor is of composite, solder-free and cement free construction, and includes a unique clamp together arrangement for securing the several parts of the rotor together in proper positional relationship.

6 Claims, 7 Drawing Figures

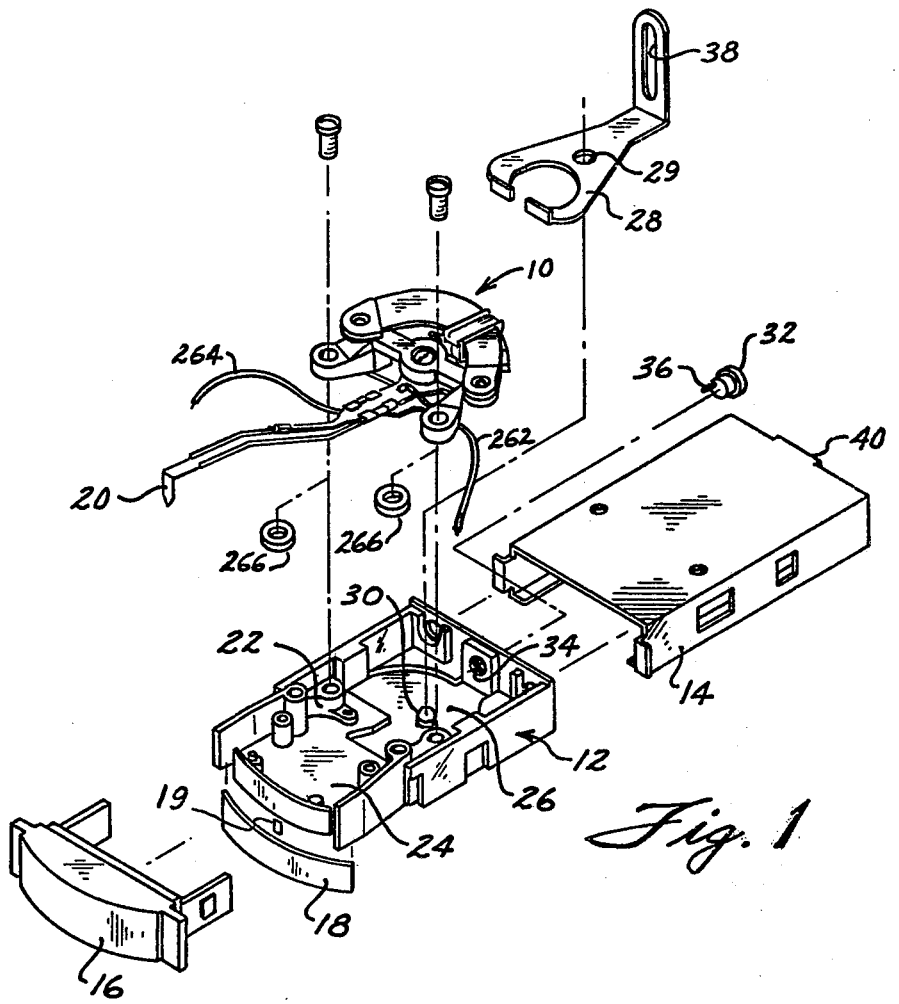
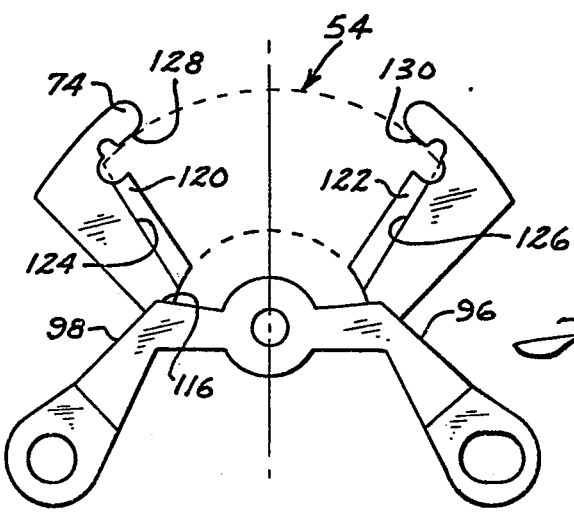

COMPACT MOVING COIL METER AND ROTOR ASSEMBLY

This is a division, of application Ser. No. 722,607, filed Sept. 13, 1976, now U.S. Pat. No. 4,064,457.

COMPACT MOVING COIL METER

This invention relates to a compact moving coil meter employing the D'Arsonval principle. The improved meter mechanism according to this invention has particular utility in the environment of an edge-wise compact meter.

BACKGROUND OF THE INVENTION

Thin flat meters typically on the order of one-half inch thick in the direction of the axis of the meter movement are known in the art. Such shallow meters are frequently referred to as "compact". A typical mechanism for such meters is disclosed in U.S. Pat. No. 3,621,393, issued Nov. 16, 1971.

In the mechanism of the above-mentioned patent, cements and epoxies are used to secure the parts of the rotor or moving element together, and cement is also used to secure the permanent magnet to a first magnetically permeable plate of the mechanism. A second magnetically permeable plate parallel to the first plate, is magnetically connected to the first plate by spacers and screws, to provide an arcuate gap to accommodate the moving coil for movement along the first plate and magnet.

While the construction disclosed in this aforementioned patent provides a meter of good accuracy which can be assembled on a mass production basis, the meter is somewhat expensive, because of the number of parts which must be separately manufactured and aligned during assembly.

A desirable feature of such meters is an air gap of arcuate section in a plane perpendicular to the pivot axis and generally parallel with or including the plane of swing of the pointer. In order to obtain consistency or repeatability from successively assembled meters, it is necessary that the air gap characteristics be uniform from meter to meter. It is however preferred that the flux in the air gap be uniform throughout the air gap so the meter movement has linear characteristics, i.e. deflects the same angular distance for each increment of current which energizes its winding. In a mechanism of the type disclosed in the aforementioned patent, cement was used to secure the magnet to one of the magnetically permeable legs. While the cement technique was satisfactory, cementing is expensive, and the deflection characteristics of the instrument sometimes varied from meter to meter. In addition, consistent magnetic coupling between the magnetically permeable plates was difficult to obtain because of the separate studs which magnetically coupled these plates together.

In the meter of the aforementioned patent the moving coil extends around both a permeable magnetic plate and the magnet cemented to the plate. Such an arrangement requires a coil of substantial axial height with substantial coil wire to provide the number of turns needed to cause deflection where the sensitivity of the meter is in the micro-amp range.

Correspondingly, even though many accurate meters of the construction of the aforementioned patent were successfully produced, and even though excellent accuracy was obtained with many of these meters, some construction difficulties, as mentioned above, were encountered.

SUMMARY OF THE INVENTION

This invention solves many of the problems and inaccuracies encountered with prior art compact meters such as that of the aforementioned patent. In accordance with this invention, the several parts of the meter mechanism are essentially cement free, and the only portion of the mechanism which requires heat curing is the coil. By virtue of the unique arrangement of the rotor of this invention, the coil can be cured separately and is subsequently mechanically connected to the rotor. Various other portions of the rotor are arranged to be clamped together so the resulting construction is both cement and solder-free.

The rotor is mounted for pivotal movement in a bridge of one piece or unitary construction having locating surfaces thereon to precisely locate a segment shaped magnet clamped to the bridge, between two arcuate plates of magnetically permeable material. The bridge further includes locating surfaces to precisely locate with respect to the rotor two magnetically permeable plates which clamp the magnet to the bridge. Uniform and consistent magnetic coupling between the magnetically permeable plates, and the plates and the magnet is assured by the construction of the meter in which at least one of the plates is generally U-shaped and the magnet is clamped to the bridge by the plates. In this construction, the plates have a substantial surface area of engagement with each other to provide a closed magnetic circuit, and parallelism of the face of the magnet with respect to the plate which extends through the coil is assured by spacer-type legs of the bridge which locate both the plates and the magnet precisely with respect to the axis of rotation of the rotor. By virtue of this arrangement, the magnet, when magnetized, in a direction parallel to the pivot axis of the rotor provides a flux gap with uniform flux characteristics throughout the range of travel of the coil, so that the meter has linear deflection characteristics, and in addition, consistent and uniform characteristics are obtained in successively assembled meters. Since the needed precision for accuracy is built into the bridge itself, the meter can readily be assembled by mass production techniques.

An additional advantage of the meter of this invention is that the coil extends only around that one of the magnetically permeable plates which is spaced from the magnet. Since the plate is relatively thin, this arrangement permits a relatively low coil having far less wire weight for a particular sensitivity, than prior art meters where the coil is of substantially greater axial height. Such reduced weight minimizes counter-balance weight requirements and correspondingly enhances accuracy of the resulting meter.

In accordance with another aspect of this invention, the sensitivity of the meter can be enhanced by selectively using thicker or thinner magnets (i.e. thicker or thinner in a direction parallel to the axis of rotation of the meter movement) by providing magnet engaging clamping plates of required heights to accommodate the different thickness magnets. By virtue of the unique arrangement of this meter construction, different thickness magnets can be used with the same rotor and bridge. It is only necessary to use a clamping plate having ends of a height needed to accommodate the magnet.

Alternatively, the magnetically permeable plate which extends through the coil can have slightly offset ends and locating faces on both its upper and lower surfaces. Such an arrangement permits inverting this coil accommodating or loop plate to permit clamping a somewhat thicker magnet directly to the bridge while maintaining air gap parallelism and uniformity. Such an alternative arrangement has the advantage of eliminating the need for an additional part where a thicker magnet is required to obtain an instrument of a desired sensitivity.

Additional features of the meter of this invention include insulating material stops to limit the extent of deflection of the coil to the operating range of the meter without danger of damaging the coil or affecting its operating characteristics, a unique rotor assembly of clamped together construction which facilitates assembly and preliminary adjustment, as well as zero adjustment when in service, and a unique casing construction having a recessed wall of sufficient depth to accommodate the greater thickness magnet when required in an instrument of high sensitivity.

Numerous other features, objects and advantages of the meter construction of this invention will become apparent with reference to the accompanying drawings.

BRIEF DESCRIPTION OF THE DRAWINGS

FIG. 1 is an exploded pictorial view showing a meter mechanism and casing according to this invention;

FIG. 3 is a bottom plan view of the meter mechanism bridge with the magnet shown in dotted lines;

DETAILED DESCRIPTION OF PREFERRED EMBODIMENT

Figure 2:
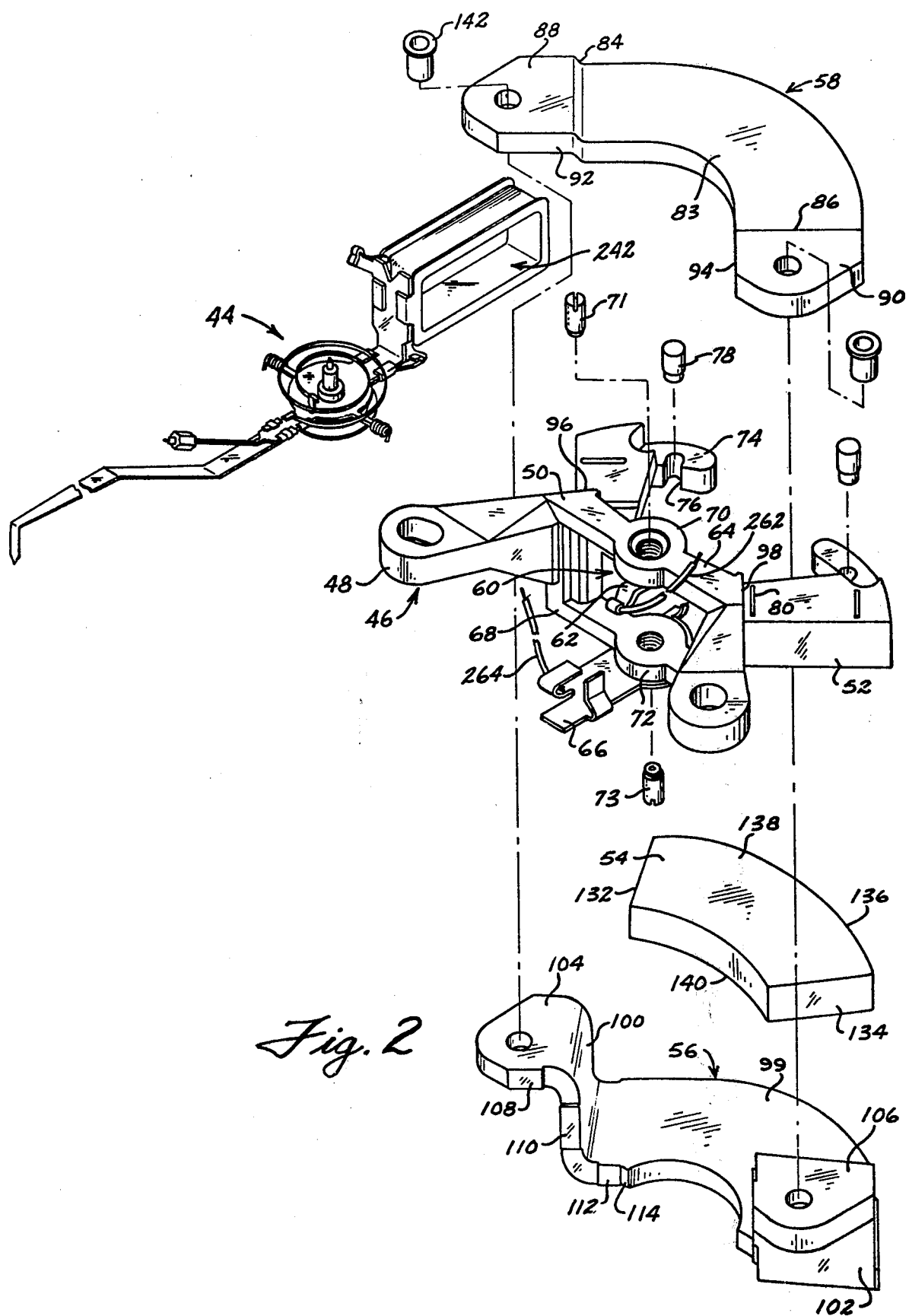
FIG. 2 is an exploded pictorial view of the meter mechanism of FIG. 1.

Referring to FIG. 1, there is shown a meter according to this invention. As shown, the meter includes a meter movement 10 having a casing 12 including a cover 14 and a transparent lens 16. A suitable scale 18 is fixed to the front of casing 12, for example, with a pressure sensitive adhesive strip 19. There is a space between scale 18 and lens 16 to accommodate pointer tip 20. Meter movement 10 is secured in casing 12 with screws that mount the meter movement on posts 22 of the casing, and which have their upper ends elevated with respect to the floor or bottom wall 24 of the casing.

Offset toward the rear of casing 12 is a recess 26 with a flat upper surface on which a zero adjust arm 28 can slide arcuately. An opening 29 in the zero adjust arm seats on a shallow post 30 in recess 26 to mount the arm for pivotal movement. A zero adjust knob 32 enters through opening 34 in the rear wall of the casing and has its eccentric tip 36 disposed in slot 38 of the upright leg of the zero adjust arm. Knob 32 is held in position in the casing by a downwardly projecting tab 40 at the rear of the cover, the tab having an opening to expose the end of the knob for adjustment with a screw driver. Cover 14 is a slide fit on casing 12 and lens 16 is a snap fit into the cover and casing.

Referring to FIG. 2, meter movement 10 includes a moveable assembly or rotor 44, and a stationary assembly. The stationary assembly includes a unitary base or bridge 46 which can be a die cast metal or molded plastic and is of non-magnetic material. Base 46 has a pair of mounting arms 48 which project forwardly from body portion 50 and diverge with respect to each other. A pair of magnetic circuit support legs 52 project rearwardly from body portion 50 and also diverge with respect to each other.

The magnetic circuit includes a generally arcuate magnet 54, a magnet support 56 of magnetically permeable material, and a clamp plate 58, also of magnetically permeable material. Clamp plate 58 and support 56 secure magnet 54 to base 46 when the magnetic circuit is assembled to the base.

Body 50 of the base 46 has a generally rectangular opening 60 to receive rotor 44. An upper terminal 62 is mounted on the under side of an upper cross leg 64 of the body, in electrically insulated relation to the body, and for limited pivotal movement. A lower terminal and zero adjust member 66 is mounted on the under side of lower cross leg 68, for limited pivotal movement. Hubs 70 and 72 are internally threaded to receive jeweled pivot bearings 71 and 73 for pivotally supporting the rotor on the base.

Projecting arcuately toward each other from the ends of the magnet support legs 52 are ears 74, each having an arcuate opening 76 to receive a coil stop 78. The coil stops are preferably formed from an insulating material such as a plastic or a molded ceramic. These stops 78 limit the extent of pivotal movement of the rotor assembly.

Formed in the top face of each magnet support leg 52 are spaced apart support ribs 80, 81 which provide a seat for clamp plate 58. Clamp plate 58 is of uniform thickness throughout its active portion 83 between bends 84 and 86 which provide offset ends 88 and 90, the upper and lower surfaces of which are essentially flat and parallel. The ends 88 and 90 are offset upwardly with respect to the plane of active portion 83, when the clamp plate is in the position shown at FIG. 2. Edges 92 and 94 of the respective ends 88 and 90 are essentially flat to engage and locate against flat locating surfaces 96 and 98 respectively of the base.

Magnet support plate 56 is generally U-shaped, having a flat body portion 99 of uniform thickness and upright legs 100 and 102 terminating at outwardly turned ends 104 and 106. The upper surfaces of ends 104 and 106 are flat and coplanar to provide substantial surface engagement with the flat coplanar surfaces of ends 88 and 90 of clamp plate 58. Such flatness and substantial surface engagement between the ends of the support 56 and clamp plate 58 minimize reluctance of the magnetic circuit. The inner edge of support plate 56 has locating faces 108, 110, 112 and 114, at each side, which engage the rear of body 50 to precisely locate the clamp plate with respect to the body of base 46. As shown at FIG. 3, the lower portion of the base includes a continuation of the surfaces 96 and 98. Locating faces 108, 110, and 112 of support plate 56 engage and locate against face 96 at one side of the base and face 98 at the other side of the base. Faces 112 and 114 engage at the corner between surfaces 98 and a rear surface 116 of the body portion 50 of the base.

FIG. 3, which is a bottom view of the base without its terminals, shows the locating surfaces of the base 46 which cooperate with the magnet to precisely position the magnet with respect to the base. Such surfaces include a horizontal surface 120 on one leg, and a coplanar horizontal surface 122 on the other leg. Projecting perpendicularly from surface 120 is a surface 124, and projecting perpendicularly from surface 122 is a surface 126. Ears 74 each have locating surfaces 128 and 130 respectively. Magnet 54 is shown in phantom lines in position between the surfaces 124, 126, 128 and 130. Correspondingly, it is apparent that side faces 132, 134 of the magnet (FIG. 2) locate precisely against surfaces 124 and 126 (FIG. 3) respectively, and the arcuate outer surface 136 of the magnet locates against surfaces 128 and 130 of the base. In addition, the flat top face 138 of the magnet locates near its ends on surfaces 120 and 122 of the base. As a result, the locating surfaces of the base precisely position the magnet with respect to the base. Magnet 54 is of a permanent magnet material such as Alnico, has its top face 138 parallel with its lower surface 140, and is magnetized in a direction perpendicular to faces 138 and 140. By virtue of the locating surfaces on clamp plate 58, magnet 54, and magnet support 56, and the locating surfaces on the base, the magnetic circuit is precisely located on the base by the simple expedient of positioning these elements on the base and securing the clamp plate to the magnet support with hollow rivets 142.

Figure 4:
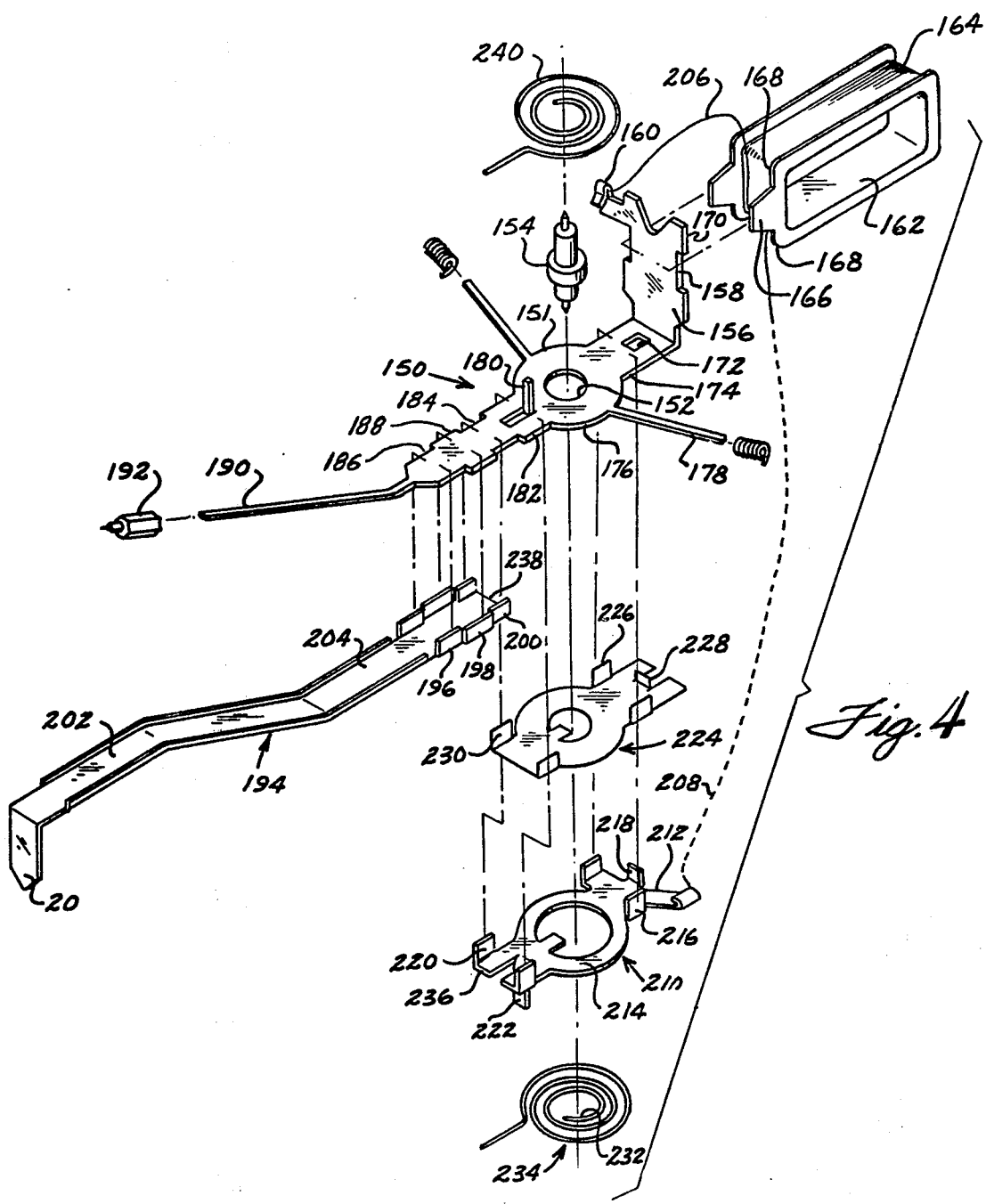
FIG. 4 is an exploded pictorial view of the rotor of the meter mechanism.

FIG. 4 shows rotor 44 of the meter of this invention. A unitary balance cross 150, formed from sheet metal, has an elongated flat body portion 151 with a generally centrally formed opening 152 to receive a pivot 154 which is pressed into the opening to secure the pivot to the balance cross. A tail 156 is bent at a right angle to the plane of body 151, this tail having a pair of outwardly opening notches 158 and a wire receiving terminal 160. A coil assembly includes a coil form 162 and a coil 164 wound on the form. The coil form is of sheet metal and has securing tabs 166 spaced apart to enter the notches 158 of upright leg 156. Tabs 166 are each tapered, and are a close fit in notches 158 so the coil assembly is precisely located with respect to the plane of body 151 of the balance cross. Coplanar edges 168 of the coil form, above and below each tab 166, abut the rear face 170 of leg 156 above and below each notch 158 so the coil assembly extends perpendicular to leg 156 and is precisely parallel to the plane of body 151. Such precise positioning is obtained by merely moving the tabs 166 through notches 158 until edges 168 abut the leg, and then bending the tabs inwardly to the position shown at FIG. 2, to secure the coil to the leg.

Formed in body 151 slightly inwardly of rear leg 156 is a rectangular opening 172. Side edges 174 of the body between this opening and a hub portion 176 of the balance cross are essentially straight and parallel to each other.

A pair of balance weight receiving arms 178 project diametrically outwardly from hub 176. Formed in the forward portion of balance cross 150, near hub 176 is a spring connecting arm 180. Arm 180 is preferably parallel with the axis of pivot assembly 154.

The forward portion of balance cross 150 includes edges 182, a pair of notches 184 and a second pair of notches 186, open at their forward ends to define rectangular lugs 188 between these notches. Balance cross 150 also has a forwardly extending stem 190 which is bent to slope upwardly, and which receives a balance weight 192 at its end.

Pointer 194 is of sheet metal and includes the down turned pointer tip 20 at one end, and pairs of pointer securing tabs 196, 198, and 200 at its other end. The body of the pointer between the ends is offset so the forward portion 202 of the pointer is in a plane above and parallel with inner end portion 204. The distance between the pairs of tabs 196, 198, and 200 is the same as the distance between the edges of the respective notches 186, lugs 188, and notches 184. Correspondingly, pointer 194 is accurately positioned and secured to the forward portion of balance cross 150 by simply moving the pointer upwardly as shown at FIG. 4 until tabs 196 and 200 locate in notches 186 and 184 respectively, whereupon tabs 196, 198, and 200 are bent over, to the position shown at FIG. 2, to clamp the pointer to the balance cross.

One end 206 of winding 164 is secured to terminal tab 160 of upright leg 156. The other end 208 of the winding is connected to a terminal element 210. Terminal element 210 has an arm 212 to which wire 208 is secured. The terminal element has a hub 214 with an opening through which pivot assembly 154 extends. At one side of the hub are a pair of parallel tabs 216 and an end tab 218. At the other side of the hub are parallel tabs 220. Projecting downwardly from the front of the hub is a return spring connecting tab 222.

Positioned between terminal 210 and balance cross 150 is a sheet material insulator 224 of a configuration conforming with the configuration of terminal 210. It will be observed from FIG. 4 that insulator 224 has tabs 226 and 228 at one side of its hub, and tabs 230 at the other side of its hub. The insulator fits against terminal 210 with its tabs inside the corresponding tabs of the terminal. Terminal 210 is secured to balance cross 150 by first positioning insulator 224 on the balance cross and by then positioning the terminal on the balance cross and bending the respective tabs 216, 218, and 220 across the balance cross to secure the terminal in position. Tab 218 is smaller than the rectangular opening 172 and insulating tab 228 of the insulator, so tab 218 is electrically insulated from the balance cross. Similarly, tabs 216 and 220 of the terminal are smaller than insulator tabs 226 and 230. When the several tabs of terminal 210 are bent across the balance cross, the terminal is secured to but insulated from the balance cross. The inner end 232 of lower return spring 234 is secured to spring arm 222. The terminal is so dimensioned that there is a space between its front edge 236 and rear edge 238 of pointer 194, to avoid grounding the terminal through the metal of the pointer. Securing the inner end of spring 240 to spring connecting arm 180 completes the assembly of the rotor.

The various parts of the meter mechanism shown at FIG. 2 are assembled in the following manner to provide the meter mechanism 10, shown at FIGS. 1 and 5. Referring to FIG. 2, after the rotor assembly 44 is assembled, as described above with reference to FIG. 4, the entire rotor assembly 44 is inserted through opening 60 of base 46, with the coil 164 between magnet support legs 52, and with pivot assembly 154 generally aligned with the axis of hubs 70 and 72. Next, stops 78 are inserted into openings 76 in rear legs 74. Clamp plate 58, is then threaded through opening 242 in the coil assembly. With the parts so positioned, jeweled pivot bearings 71 and 73 are threaded into the hubs to mount rotor assembly 44 for pivotal movement. It will be seen from FIG. 5, that with the meter movement disposed horizontally in its normal operating position, pivot assembly 154 is vertical, and the rotor is mounted to rotate about a vertical axis.

Figure 5:
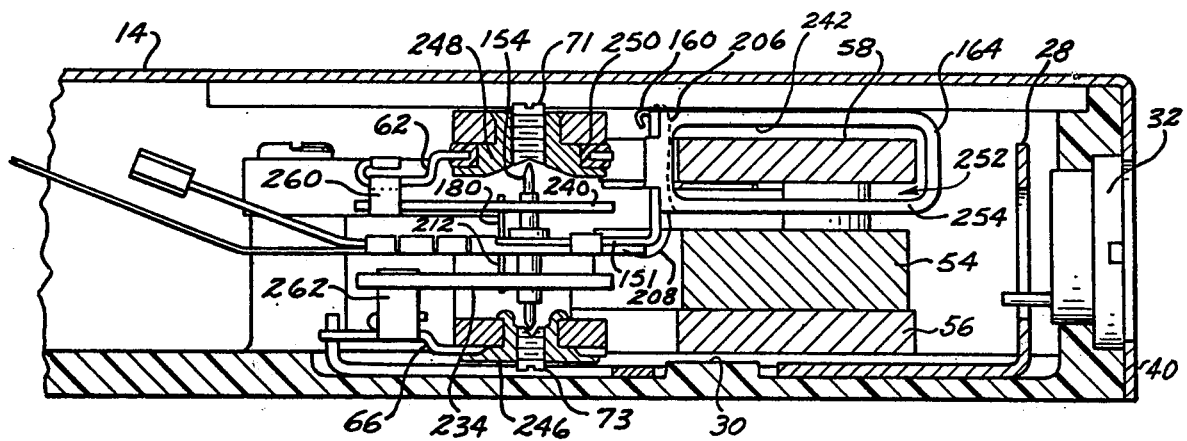
FIG. 5 is an enlarged front elevational view in partial section of the meter movement and casing.

FIG. 5 also shows in greater detail, a staked or swaged insert 246 which mounts terminal 66 for limited pivotal movement, and a staked or swaged insert 248 which mounts terminal 62 via an intermediary insulating bushing 250.

Magnet 54 is then seated against the base in the manner previously described with reference to FIG. 3. Then, magnet support plate 56 is placed beneath the magnet, and hollow rivets 142 are inserted through the openings in clamp plate 58 and magnet support 56. Plates 58 and 56 are then pushed inwardly toward hub 70 so edges 92 and 94 abut locating surfaces 96 and 98 of the base, and surfaces 108, 110, 112 and 114 abut the respective locating surfaces 98 and 116 of the base. A clamping pressure is then applied between ends 88 and 104 and between ends 90 and 106 of the clamp and magnet support plates. While this clamping pressure is maintained, hollow rivets 142 are upset to rivet the plates together to secure the plates and magnet 54 to the base. Correspondingly, by the simple expedient of positioning the magnet against the locating surfaces of the base, and positioning clamp plate 58 and magnet support plate 56 against the locating surfaces on the base, it is assured that these parts of the magnetic circuit are in a predetermined position with respect to the rotor assembly. Such predetermined positioning, in successively assembled meters, provides repeatable accuracy with minimal calibration. By virtue of the flat engaging faces of the ends of clamp plate 58 and magnet support plate 56, a closed loop magnetic circuit of minimal reluctance between the plates is provided.

As shown at FIG. 5, there is an air gap 252 between clamp plate 58 and magnet 54. Lower leg 254 of the coil assembly extends through this gap. As previously mentioned, magnet 54 is magnetized in a direction parallel to the axis of rotation of the rotor, and correspondingly, when the coil is energized, a magnetic force is created which causes the coil and rotor to pivot about the meter axis.

With the rotor 44 in position and the magnetic circuit assembled, the outer ends of return springs 234 and 240 are secured respectively to base terminal 62 and base terminal 66. As shown at FIG. 5, terminal 62 has a downwardly projecting tab 260 to which the outer end of spring 240 is secured as by welding. Similarly, terminal 66 has an upwardly projecting tab 262 to which the outer end of lower spring 234 is secured by welding. The limited pivotal movement of terminals 62 and 66 provides for adjusting the zero point of the rotor. Wires 262 and 264 are connected respectively to terminals 62 and 66. These wires extend to the rear of the casing 12 and are connected to terminal screws (not shown), via which external connections are made to the meter.

With reference to FIGS. 1, 2, 4 and 5 it will be apparent that the coil 164 is electrically connected in series between terminal wires 262 and 264, the electrical path including wire 262, terminal 62, return spring 240, arm 180 of the balance cross, the balance cross body 151, terminal 160 of the balance cross, wire 206 of the coil, coil 164, wire 208 of the coil, terminal arm 212 of terminal 210, spring 234, terminal 66 and wire 264.

Figure 6:
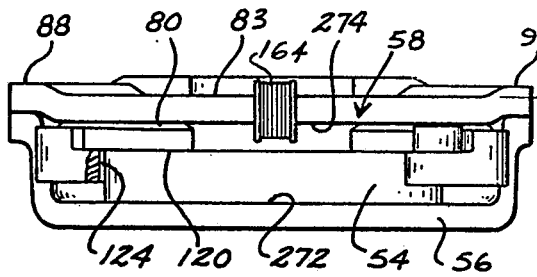
FIG. 6 is a rear elevational view of the meter mechanism with a magnet of a first thickness.
Figure 7:
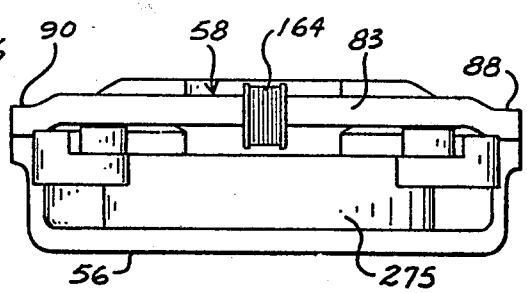
FIG. 7 is a view corresponding to FIG. 6 and showing the mechanism with a magnet of different thickness.

FIGS. 6 and 7 show a distinct advantage of meter mechanism 10 including clamp plate 58 with offset ends 88 and 90. FIG. 6 is a rear view of the embodiment of FIGS. 1-5 where clamp plate 58 is secured to magnet support plate 56 with the ends 88 and 90 of the clamp plate projecting upwardly with respect to the plane of the active portion or body 83 of the clamp plate. In order to locate and hold the magnet 54 in position against any movement, even if the meter movement is dropped or otherwise abused, the magnet 54 has a thickness such that a clamping pressure is required to initially bring the ends of the clamp plate and magnet support plate into engagement. Correspondingly, with reference to FIG. 6, the thickness or height of magnet 54 plus the thickness of that portion of a magnet support leg 52 between its lower surface 120, and the top of its ribs 80 is very slightly greater than the distance between upper surface 272 of magnet support 56 and lower surface 274 of clamp plate 58. In the meter of FIGS. 1-6, the flux density produced in air gap 252 by magnet 54 is sufficient to provide a meter movement of good sensitivity, on the order of 50 microamps. Where a far more sensitive meter is required, the construction of FIG. 7 can be used, this construction requiring only a thicker magnet to obtain a more sensitive meter movement.

Referring to FIG. 7, a clamp plate 58 identical to clamp plate 58 of FIG. 6, but inverted, secures magnet support 56 and a magnet 275 in position on the base. Magnet 275 has a thickness which is greater than the thickness of magnet 54 by an amount equal to twice the offset 276 of ends 88 and 90 of the clamp plate 58 with respect to its body 83. As shown at FIG. 7, coil 164 is in precisely the same position with respect to the base 46 as the coil is in the embodiment of FIG. 6. The same support plate 56 is used in the FIG. 7 embodiment. Since body portion 83 of clamp plate 58 is flat and parallel, the ribs 80 position this body in the same plane with respect to the coil and base, as in the FIG. 6 embodiment. Correspondingly, a more sensitive meter is obtained merely by substituting the thicker magnet 275 for the magnet 54, and inverting clamp plate 58.

The meter movement of FIG. 7 has a height greater than the meter of FIG. 6, by an amount equal to the greater thickness of magnet 275. Casing 12 of FIG. 1 can be used with the thicker or higher meter movement of FIG. 7 by the simple expedient of providing spacing washers 266 (FIG. 1), between the mounting legs 48 and support posts 22 of the casing. Such washers elevate the meter mechanism slightly with respect to the base and recess 26, so the bottom face of magnet support 56 will clear projection 30 at recess 26 of the base.

Correspondingly, by virtue of the unique clamping arrangement of the magnetic circuit of the meter of this invention, only one additional part, namely a thicker magnet, is required to obtain substantially greater sensitivity, all other parts remaining essentially the same.

Of course, where magnets of a thickness different from magnet 54 or magnet 275 are required in order to construct meter movements of a desired sensitivity, clamp plate 58 can be flat, and a magnet support 56 of the required depth to clamp the magnet to the legs 52 can be used. This magnet support can have a depth either greater or shallower than the magnet support 56. Alternatively, a clamp plate with ends 88 and 90 offset either more or less than those of the clamp plate 58 can be used with the magnet support plate 56 to accommodate magnets of a thickness different from magnets 54 and 275.

Since the plane of the active portion 83 of clamp plate 58 is determined by the engagement of plate 58 with the ribs 80 on legs 52 of the bridge, and since the coil 164 extends around clamp plate 58 and not around the magnet and magnet support plate, the same bridge and rotor can be used to construct meters of different sensitivity by the simple expedient of substituting a magnet of the required thickness, and using either the clamp plate and magnet support plate shown at FIGS. 6 or 7, or using the modified clamp plate and magnet support plate mentioned above. Such construction is possible since the rotor and bridge are so constructed and arranged that there is no obstruction in the region occupied by the magnet and magnet support plate which prevents the use of either a thicker magnet or a support of greater height than the one shown at FIGS. 6 and 7.

While preferred embodiments of a meter assembly including the unique meter mechanism of this invention are shown and described herein, it will be appreciated that changes can be made without departing from the scope of the invention as mentioned herein and defined in the appended claims.

What is claimed is:

1. An eccentric coil edgewise reading meter comprising, a base, a rotor assembly mounted on the base for pivotal movement about an axis, a magnetic circuit at one side of the axis, said rotor assembly comprising a unitary balance cross of electrically conducting material, a coil supported by the balance cross and radially disposed on the same side of the pivot axis as the magnetic circuit, a pointer supported by the balance cross and on the opposite side of the axis from the magnetic circuit, and a terminal supported by the balance cross and electrically insulated therefrom, said balance cross including a leg generally parallel with the axis and on the same side of the axis as the magnetic circuit, and a body portion including a pointer support portion on the opposite side of the axis from the magnetic circuit, means for securing said coil to the balance cross leg and comprising oppositely opening locating notches in said leg, and tabs on said coil assembly extending through said notches and being bent across said leg to secure said coil assembly to the leg, means for securing said pointer to the pointer support portion of said balance cross and comprising locating edges on said pointer support portion and tabs on said pointer engaging said locating edges and bendable across said body portion to secure the pointer to the balance cross, means securing said terminal to said balance cross and comprising terminal locating edges on said balance cross, and tabs projecting in the same direction from said terminal and bendable across said body portion to secure the terminal to the balance cross, means between the balance cross and terminal for insulating the terminal from the balance cross, a second terminal carried by the balance cross, said coil assembly including a winding having one end thereof electrically connected to said first mentioned terminal and the other end thereof electrically connected to said second terminal, means electrically connected to said terminals for electrically connecting said terminals to terminals on the base, and means secured to said balance cross for pivotally mounting said rotor assembly on the base.

2. An eccentric coil meter according to claim 1 wherein said means mounting said coil assembly on said balance cross further comprises cooperating stop surfaces on said balance cross leg and coil assembly for precisely locating said coil assembly with respect to said balance cross leg.

3. An eccentric coil meter according to claim 1 wherein said balance cross further comprises, unitary weight mounting arms for mounting balance weights on said rotor assembly.

4. An eccentric coil meter according to claim 1 wherein said body portion of said balance cross is generally flat and perpendicular to the pivot axis of the rotor, and said first mentioned terminal and pointer are generally coplanar with each other in the region of the body portion of the balance cross.

5. An eccentric coil meter according to claim 1 wherein said means for insulating said first mentioned terminal from said balance cross comprises a sheet of insulating material sandwiched between said first mentioned terminal and said body portion of the balance cross, said sheet having a configuration generally similar to said first terminal.

6. An eccentric coil meter according to claim 1 wherein said balance cross further comprises, first terminal means on the same side of the balance cross as said pointer, said first mentioned terminal further comprises, second terminal means on the same side of the pivot axis as said pointer, and means for electrically connecting said first and second terminal means to terminals on said base to energize said coil.

* * * * *